US008416969B2

(12) United States Patent
Enjalbert et al.

(10) Patent No.: US 8,416,969 B2
(45) Date of Patent: Apr. 9, 2013

(54) AMPLIFIER CIRCUIT

(75) Inventors: Jerome Enjalbert, Fonsorbes (FR); Zakaria Mengad, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/742,663

(22) PCT Filed: Nov. 15, 2007

(86) PCT No.: PCT/IB2007/055388
§ 371 (c)(1),
(2), (4) Date: May 13, 2010

(87) PCT Pub. No.: WO2009/063276
PCT Pub. Date: May 22, 2009

(65) Prior Publication Data
US 2010/0246858 A1    Sep. 30, 2010

(51) Int. Cl.
*H03F 99/00* (2009.01)
*H03F 3/04* (2006.01)

(52) U.S. Cl. .......... 381/120; 381/28; 330/261; 330/296; 330/297

(58) Field of Classification Search .................. 381/120, 381/28, 111, 118, 121; 330/273, 297, 296, 330/261
See application file for complete search history.

(56) References Cited

U.S. PATENT DOCUMENTS

| 7,015,683 | B1 | 3/2006 | Choksi et al. | |
| 2002/0063599 | A1* | 5/2002 | Escobar-Bowser et al. | ... 330/274 |
| 2005/0007198 | A1* | 1/2005 | Versteegen | ..................... 330/264 |
| 2009/0002070 | A1* | 1/2009 | Swanson | ........................ 330/267 |

FOREIGN PATENT DOCUMENTS

| EP | 0602163 B1 | 8/1997 |
| WO | 91/07814 | 5/1991 |

OTHER PUBLICATIONS

Shi-Cai Qin et al: "CMOS OTA With Improve Performance" Microelectronics and VLSI, 1995, Tencon 1995, IEEE Region 10 International Conference on Hong Kong Nov. 6-10, 1995, New York, NY, USA, IEEE, US, Nov. 6, 1995, pp. 141-142.
Agazzi O et al: "An Analog Front End for Full-Duplex Digital Transceivers Working Ontwisted Pairs" IEEE Journal of Solid-State Circuits, IEEE Service Center, Piscataway, NJ, US, vol. 24, No. 2, Apr. 1, 1989, pp. 229-240.
International Search Report and Written Opinion correlating to PCT/IB2007/055388 dated Oct. 9, 2008.

* cited by examiner

*Primary Examiner* — Xu Mei (57) ABSTRACT

An amplifier circuit comprises differential amplification circuitry comprising an input stage having first and second differential inputs, and an output stage, having respective first and second amplifier components with first and second differential outputs. The first amplifier component of the output stage comprises a first power transistor operably coupled to the first differential output and driven by a first differential output of the input stage, and a third power transistor operably coupled to the first differential output of the amplifier circuit and driven by a second output of the input stage. The second amplifier component comprises a second power transistor operably coupled to the second differential output and driven by a second output of the input stage, and a fourth power transistor operably coupled to the second differential output and driven by the first output of the input stage. Each of the first and second power transistors of the first and second amplifier components is driven in a current mirror arrangement by the respective first and second output of the input stage.

20 Claims, 8 Drawing Sheets

AMPLIFIER CIRCUIT

FIELD OF THE INVENTION

The invention relates to an amplifier circuit, and more particularly to an amplifier circuit, and a semiconductor device comprising an amplifier circuit. The invention is applicable to, but not limited to, a semiconductor device and an amplifier circuit comprising differential amplification circuitry.

BACKGROUND OF THE INVENTION

It is known for electronic devices, such as mobile telephone handsets and the like, to comprise audio functionality. Traditionally, such electronic devices comprise traditional electromagnetic speaker components that use a coil and a cone or diaphragm to convert electrical signals into audio signals. Manufacturers of such electronic devices are continually striving to reduce weight and size of the devices, whilst increasing functionality, in order to meet market demands and provide a competitive advantage. As will be appreciated by a skilled artisan, the use of a cone and coil within traditional electromagnetic speakers results in these speakers being relatively bulky. Thus, traditional electromagnetic speakers tend to be one of the most problematic features when trying to minimise the size and weight of devices incorporating such traditional speaker components.

Piezo-ceramic flat speakers are known, to use a ceramic disk glued to a membrane to convert electrical signals into audio signals. Consequently, such piezo-ceramic flat speakers comprise a substantially reduced thickness, compared to traditional electromagnetic speakers, for example in a region of 0.8 mm, which is approximately one fifth that of the thinnest traditional electromagnetic speakers. Furthermore, such piezo-ceramic flat speakers are light weight. Advancements in piezo-ceramic technology have resulted in piezo-ceramic speakers being capable of meeting the standards of audio reproduction required for electronic devices, such as mobile telephone handsets, whilst also enabling a reduction in size and weight of such devices. Piezo-ceramic speakers also provide the additional benefits of low energy requirements at low frequencies, and higher acoustic output compared to electromagnetic speakers (in the order of 60%).

Class D amplifiers are well known in the art, and are generally deemed suitable for driving electromagnetic speakers. Class D amplifiers use switching technology to achieve high power efficiency. In particular, electromagnetic speakers typically present a relatively high impedance (e.g. 100Ω) at the operating frequency of the Class D amplifier (e.g. 1 MHz). However, the impedance of piezo-ceramic speakers is a purely capacitive reactance. Consequently, Class D amplifiers are unsuitable for driving piezo-ceramic speakers, since their impedance is close to that of a short circuit at the operating frequency of a Class D amplifier.

Instead, linear amplification design is required to drive piezo-ceramic speakers, such as provided by a Class AB amplifier.

Figure 1A:
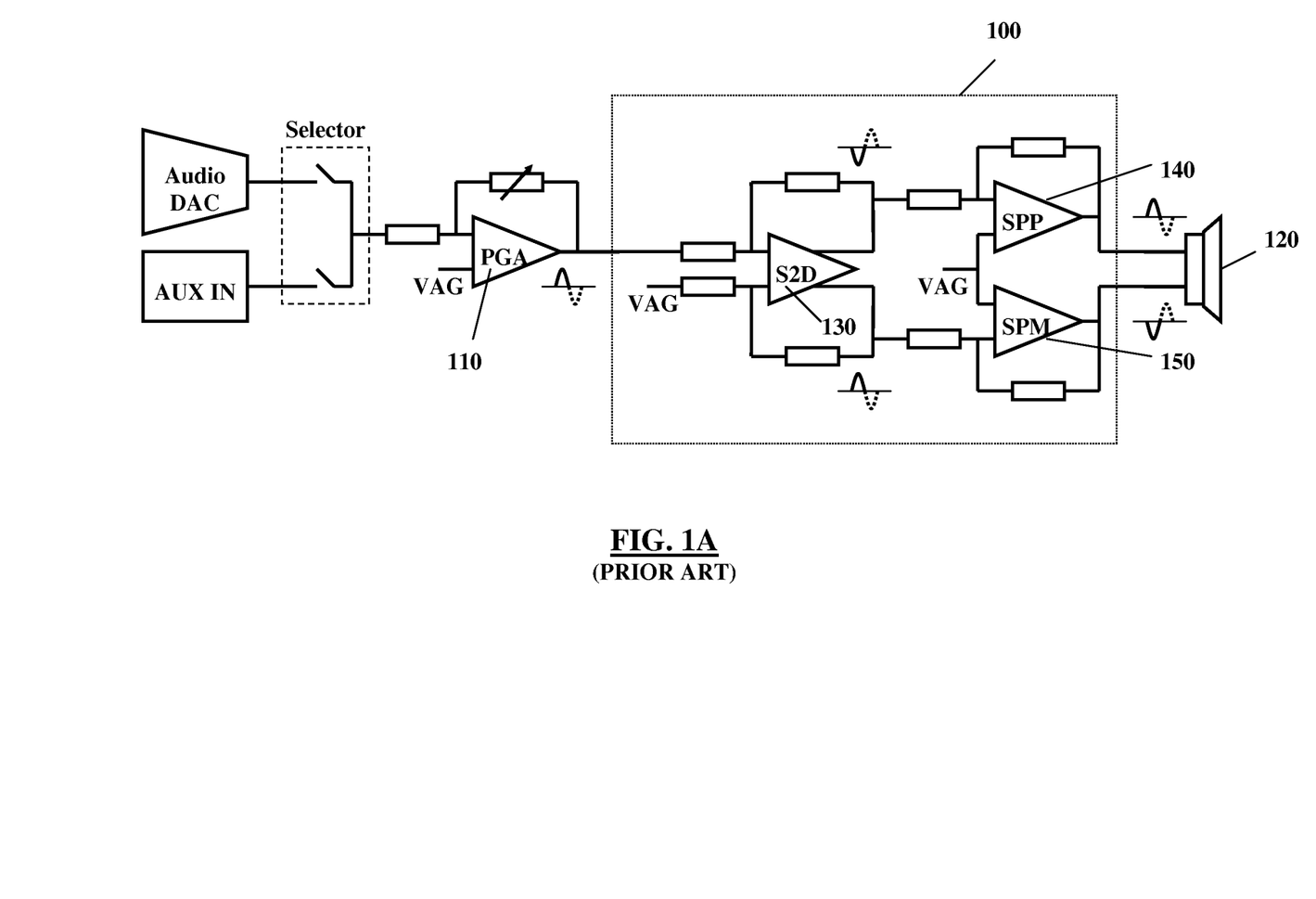
FIG. 1A illustrates an example of conventional amplification circuitry, with FIG. 1B illustrating conventional miller Operational Transconductance Amplifier (OTA) and a folded cascode OTA circuit used therein.

FIG. 1 illustrates an example of conventional amplifier circuitry 100 for converting a single ended signal at an output of a Programmable Gain Amplifier (PGA) 110 into a differential signal applied to a speaker 120, such as a piezo-ceramic speaker. The amplifier circuitry 100 comprises a Single to Differential (S2D) amplifier circuit 130 and two single ended Class AB linear power amplifier circuits 140, 150. Unfortunately, for electronic devices such as mobile telephone handsets, the use of three amplifier circuits requires a large silicon area, which is undesirable when silicon area is at a premium, due to a need to reduce the cost of such devices to meet market demands.

In addition, each amplifier circuit contributes independently to the output noise of the amplifier circuitry, resulting in a relatively high noise floor. Furthermore, the use of three amplifiers circuits results in a large quiescent current, requiring complex quiescent current control circuitry. Consequently, the use of three amplifier circuits, in this manner, to provide the linear amplification required for piezo-ceramic speakers is undesirable.

Figure 1B:
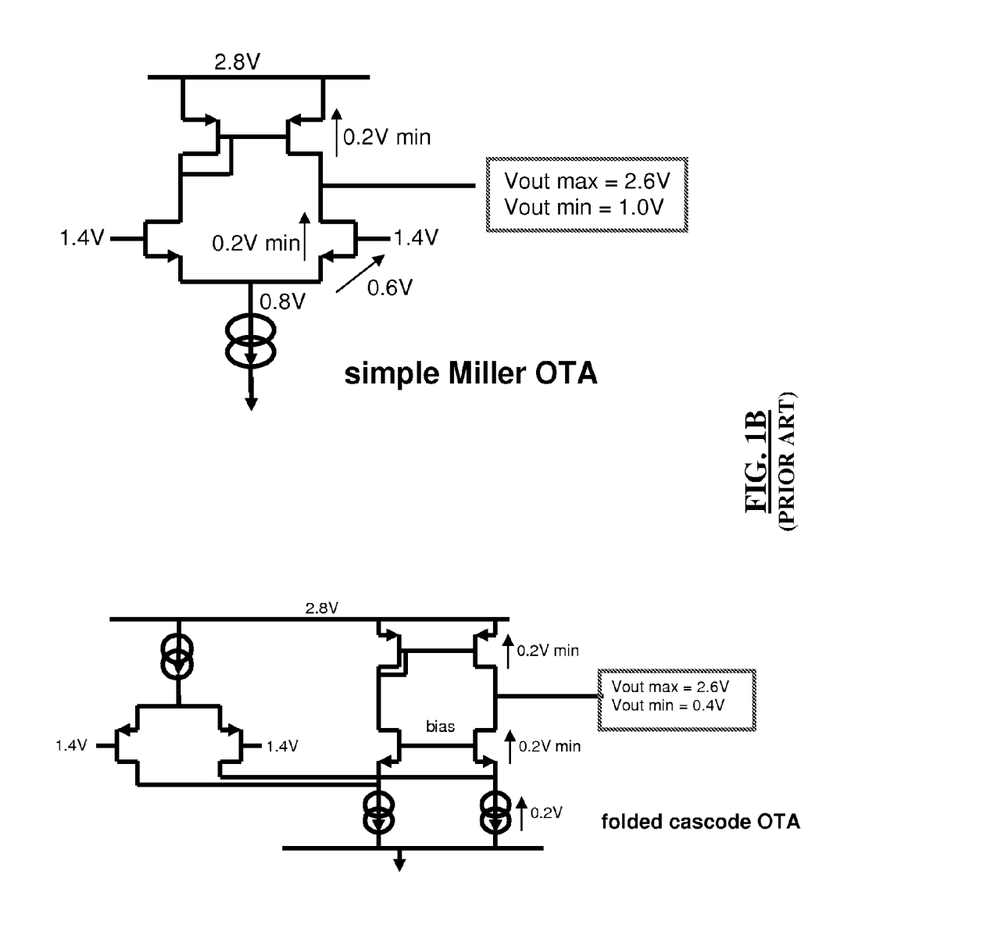

A further problem with conventional single ended Class AB linear power amplifier circuits 140, 150 is that their input stages are typically required to have rail-to-rail capability, e.g. capability for the voltage of the output nodes of the input stage to reach the levels of supply and ground rails in order to efficiently drive the power transistors of the output stages. As a result, a folded-cascode structure, as illustrated in FIG. 1B, is typically used for the input stage, resulting in a high component count as well as requiring additional silicon area. A folded-cascode structure is a differential amplifier stage in which additional branches allow the output node to have a larger voltage swing capability.

WO1991/007814 describes an amplifier that has a folded-cascode input stage, an AB class output stage, a first common mode feedback circuit that stabilizes the input stage and a second common mode feedback circuit that stabilizes the output stage. Ten capacitors are needed for frequency compensation, which results in a very area-consuming solution. This amplifier is not adapted to low supply voltages (it is supplied with 5V) because the class AB function is achieved due to a transconductance stage that requires a relatively large voltage headroom. Quiescent current control is achieved by component matching only and there is no minimal current regulation, which is detrimental to the Total Harmonic Distortion.

Thus, a need exists for an improved semiconductor device with an amplifier circuit where at least some of the aforementioned disadvantages with prior art arrangements are substantially alleviated.

SUMMARY OF THE INVENTION

In accordance with aspects of the invention, there is provided an amplifier circuit and a semiconductor device with an amplifier circuit as defined in the appended Claims.

BRIEF DESCRIPTION OF THE DRAWINGS

Exemplary embodiments of the invention will now be described, by way of example only, with reference to the accompanying drawings, in which.

DESCRIPTION OF EMBODIMENTS

Embodiments of the invention will be described in terms of amplifier circuitry in a semiconductor device for converting a single ended signal at an output of a Programmable Gain Amplifier (PGA) into a differential signal applied to a speaker, such as a piezo-ceramic speaker.

Although embodiments of the invention will be described in terms of amplification circuitry for converting a single ended signal into a differential signal (generally referred to as single-to-differential amplification), it will be appreciated that the inventive concept may equally be applied to differential-to-differential signal amplification circuitry. Furthermore, although embodiments of the invention will be described in terms of amplification circuitry within electronic devices, for example mobile telephone handsets, it will be appreciated that the inventive concept herein described may be embodied in any apparatus that incorporates amplification circuitry.

In summary, the inventive concept proposes an amplifier circuit, and a semiconductor device comprising such an amplifier circuit, where the amplifier circuit comprises differential amplification circuitry, the differential amplification circuitry comprising an input stage and an output stage. The input stage is operably coupled to first and second differential inputs of the amplifier circuit. The output stage is operably coupled to first and second differential outputs of the amplifier circuit, and comprises first and second amplifier components. The first amplifier component of the output stage comprises a first power transistor operably coupled to the first output of the amplifier circuit and driven by a first output of the input stage, and a second power transistor operably coupled to the first output of the amplifier circuit and driven by a second output of the input stage. The second amplifier component comprises a first power transistor operably coupled to the second output of the amplifier circuit and driven by the second output of the input stage, and a second power transistor operably coupled to the second output of the amplifier circuit and driven by the first output of the input stage. Each of the first power transistors of the first and second amplifier components is driven by the respective output of the input stage in a current mirror fashion.

Figure 2:
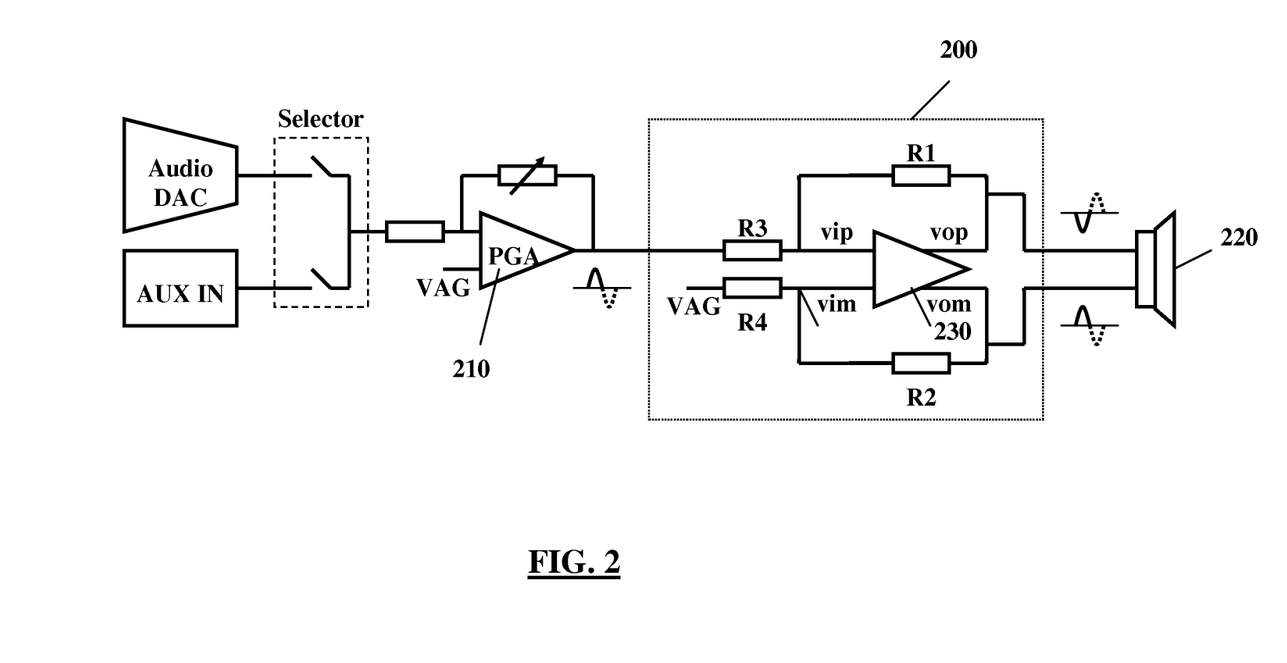
FIG. 2 illustrates a semiconductor device in accordance with some embodiments of the invention.

Referring now to FIG. 2, there is illustrated a semiconductor device 200 in accordance with some embodiments of the invention. For the embodiment illustrated in FIG. 2, the semiconductor device 200 comprises circuitry arranged to convert a single ended signal at an output of a Programmable Gain Amplifier (PGA) 210 into a differential signal for a speaker 220, such as a piezo-ceramic speaker. The semiconductor device 200 comprises an amplifier circuit 230, such as a class AB linear amplifier circuit. The use of only a single amplifier circuit, as opposed to three in a conventional amplifier circuitry, significantly reduces the required silicon area, and results in a lower quiescent current and a relatively low noise floor. VAG is a reference voltage and is set generally to half of the supply rail voltage.

Figure 3:
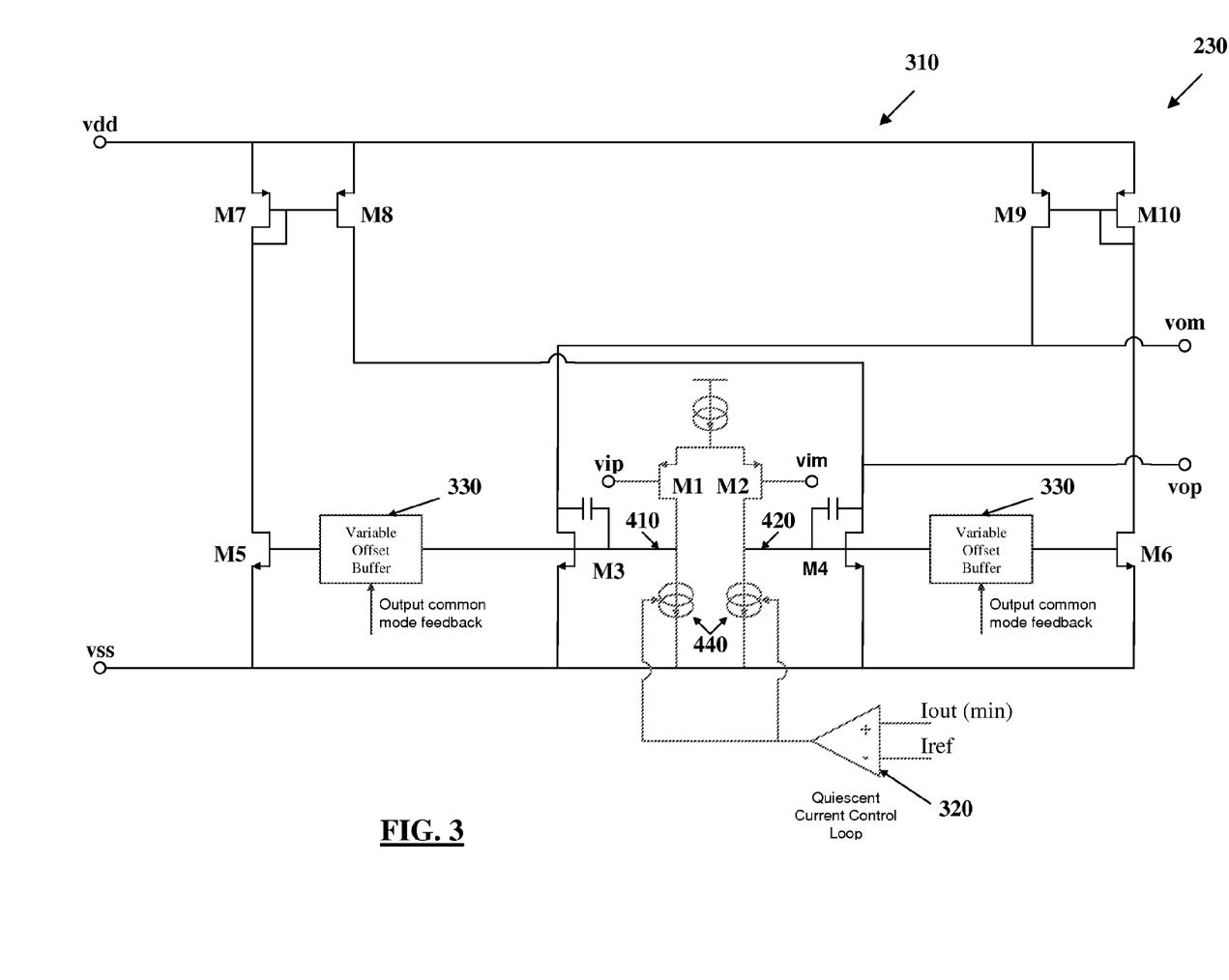
FIG. 3 illustrates an example of an amplifier circuit according to an embodiment of the invention.

Referring now to FIG. 3, there is illustrated an example of the amplifier circuit 230 according to an embodiment of the invention. The amplifier circuit 230 comprises first and second differential inputs vip, vim, and first and second differential outputs vop, vom. The amplifier circuit 230 further comprises differential amplification circuitry 310 for amplifying differential signals received at the differential inputs vip, vim and providing the amplified signals to the differential outputs vop, vom.

Furthermore, for the illustrated embodiment, the amplifier circuit 230 further comprises common mode voltage control in a form of variable offset buffers 330, located between the outputs 410, 420 of the input stage and the first power transistors M8, M9 of the amplifier components of the output stage. More particularly, for the illustrated embodiment, the variable offset buffers 330 are located between the outputs 410, 420 of the input stage and the current mirrors 450, 460 of the amplifier components of the output stage, and are controlled by output common mode feedback, as described further with respect to FIG. 6.

Figure 4:
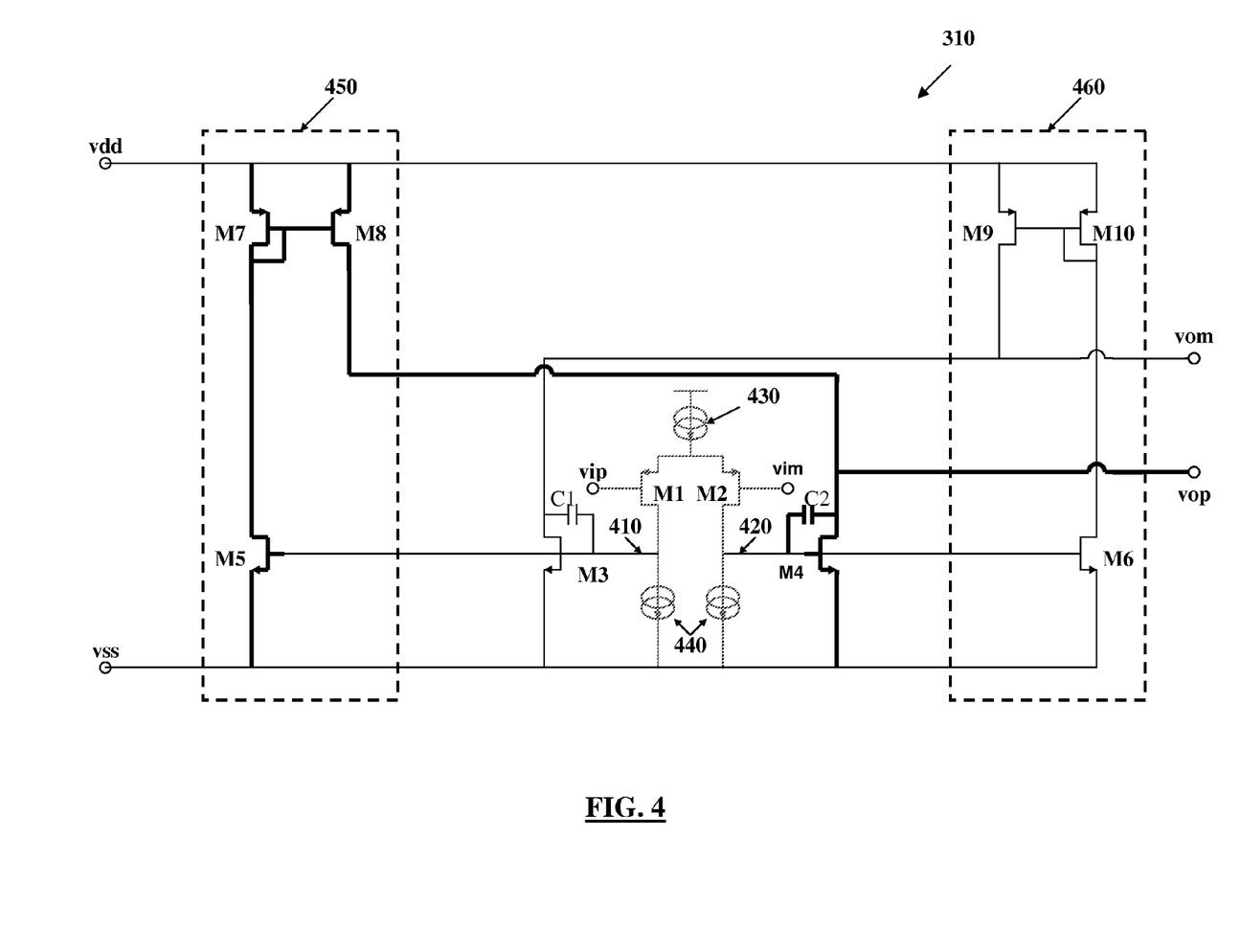
FIG. 4 illustrates an amplifier circuit comprising differential amplification circuitry according to an embodiment of the invention.

Referring now to FIG. 4, there is illustrated the differential amplification circuitry 310 of the amplifier circuit 230, comprising an input stage and an output stage, according to an embodiment of the invention. The output stage of differential amplification circuitry 310 comprises first and second amplifier components. The first amplifier component, illustrated by heavy lines in FIG. 4 for clarity, comprises a first power transistor M8 operably coupled to the first output vop of the amplifier circuit 230 and driven by a first output 410 of the input stage, and a second power transistor M4 operably coupled to the first output vop of the amplifier circuit 230 and driven by a second output 420 of the input stage. The second amplifier component comprises a first power transistor M9 operably coupled to the second output vom of the amplifier circuit 230 and driven by the second output 420 of the input stage, and a second power transistor M3 operably coupled to the second output vom of the amplifier circuit 230 and driven by the first output 410 of the input stage.

Each of the first power transistors M8, M9 of the first and second amplifier components is driven by the respective outputs 410, 420 of the input stage in a current mirror fashion. Accordingly, the first amplifier component further comprises transistors M5 and M7, operably coupling the first output 410 of the input stage to the power transistor M8, and enabling the first output 410 of the input stage to drive the power transistor M8 in a current mirror fashion. Similarly, the second amplifier component further comprises transistors M6 and M10, operably coupling the second output 420 of the input stage to the power transistor M9 in current mirror fashion. For the embodiment illustrated, transistors M7, M8, M9 and M10 each comprise a P-Channel Metal Oxide Semiconductor Field Effect Transistor (PMOS). Conversely, transistors M3, M4, M5 and M6 each comprise an N-Channel Metal Oxide Semiconductor Field Effect Transistor (NMOS).

Each of the amplifier components utilise both outputs 410, 420 of the input stage to drive the outputs vop, vom of the amplifier circuit 230. In this manner, the outputs vop, vom of the amplifier circuit 230 may be driven in a substantially balanced manner. Furthermore, by driving the power transistors M8 and M9 in a current mirror fashion, the input stage is not required to have a rail-to-rail capability in order to be able to efficiently drive the power transistors M8 and M9.

For the illustrated embodiment, the input stage of differential amplification circuitry 310 comprises a conventional Miller Operational Transconductance Amplifier (OTA) comprising a first transistor M1 and a second transistor M2, providing a substantially matched transistor pair operably coupling the first and second differential inputs vip, vim to the first and second outputs 410, 420 respectively of the input stage. For the embodiment illustrated, transistors M1 and M2 each comprise a P-Channel Metal Oxide Semiconductor Field Effect Transistor (PMOS). The gates for transistors M1 and M2 are connected to inputs vip, vim respectively, and the drains for transistors M1 and M2 are connected to the outputs 410, 420 respectively of the input stage. The sources for transistors M1 and M2 are both connected to a current source 430. Outputs 410, 420 of the input stage are further connected to current sinks 440.

As will be appreciated by a skilled artisan, the use of a Miller OTA for the input stage results in a reduced component count compared to a folded-cascode structure, thereby resulting in lower component costs and a reduced silicon area requirement.

Although this embodiment has utilised a Miller OTA for the input stage, it is envisaged in other embodiments of the invention that alternative input stage configurations may be employed.

When a differential signal, such as an audio signal, is present at inputs vip, vim, the input stage, or more particularly transistors M1 and M2, amplify the difference, or error, between the two inputs vip, vim.

In the case where a low (e.g. negative) voltage is present at one of the inputs vip, vim, this low voltage is communicated to the gate of the corresponding PMOS transistor M1, M2, allowing current from the current source 430, to flow through the transistor, the lower the voltage present at the gate of the transistor, the more current flowing through the transistor, and thus the higher the voltage at the corresponding output 410, 420 of the input stage.

Conversely, in a case where a high voltage is present at one of the inputs vip, vim, this high voltage is communicated to the gate of the corresponding PMOS transistor M1, M2, thereby restricting current from the current source 430 from flowing through the transistor, the higher the voltage present at the gate of the transistor, the lower the current flowing through the transistor, and thus the lower the voltage at the corresponding output 410, 420 of the input stage.

Taking as an example a case where a lower voltage is present at the first input vip of the amplifier circuit 230, and a higher voltage is present at the second input vim of the amplifier circuit 230, the first output 410 of the input stage will have a relatively higher voltage level than that of the second output 420 of the input stage. As will be appreciated by a skilled artisan, the greater the difference between the voltages present at the inputs vip, vim the greater the amplified difference between the voltages at the outputs 410, 420 of the input stage.

As previously mentioned, the output stage of the differential amplification circuitry 310 comprises first and second amplifier components, each amplifier component comprising a first power transistor M8, M9 operably coupled to an output vop, vom of the amplifier circuit 230, and driven by an output 410, 420 of the input stage in a current mirror fashion, via transistors M5, M6, M7 and M10. In particular, the gates of NMOS transistors M5 and M6 are connected to the outputs 410, 420 of the input stage, and the source of each transistor M5 and M6 is connected to a negative power rail Vss. The drains of transistors M5 and M6 are connected to the drains of PMOS transistors M7 and M10 respectively, the sources for which are connected to a positive power rail vdd. The gates of transistors M7 and M10 are connected by their respective drains, and to the gates of PMOS transistors M8 and M9. The sources of transistors M8 and M9 are also connected to the positive power rail vdd, and the drains of the transistors M8 and M9 are connected to outputs vop, vom of the amplifier circuit 230 respectively. In this manner, transistors M5, M7 and M8, and transistors M6, M9 and M10 provide common source NMOS and PMOS current mirrors 450, 460 for each amplifier component of the output stage, via which the first power PMOS transistors M8, M9 are driven by the respective outputs 410, 420 of the input stage.

For each amplifier component, in a case where the output 410, 420 of the input stage by which the current mirror 450, 460, is driven has a high voltage, this high voltage is communicated to the gate of the NMOS transistor M5, M6 of that current mirror 450, 460, thereby allowing current flow there through. In this manner, the voltage at the gate of the power transistor M8, M9 of the current mirror 450, 460 is pulled down towards the negative power rail vss, allowing current to flow through the transistor M8, M9, and thus to the output vop, vom of the amplifier circuit 230. As will be appreciated by a skilled artisan, the higher the voltage at the output 410, 420 of the input stage, the higher the current flowing through the power transistor M8, M9 and thus the higher the current flowing to the output vop, vom of the amplifier circuit 230.

Conversely, in a case where the output 410, 420 of the input stage by which the current mirrors 450, 460 is driven has a low voltage, this low voltage is communicated to the gate of NMOS transistor M5, M6 of that current mirror 450, 460, thereby restricting current flow there through. In this manner, the voltage at the gate of the power transistor M8, M9 of the current mirror 450, 460 is pulled up towards the positive power rail vdd, thereby restricting current flow through the transistor M8, M9, and thus to the output vop, vom of the amplifier circuit 230. As will be appreciated by a skilled artisan, the lower the voltage at the output 410, 420 of the input stage, the lower the current flowing through the power transistor M8, M9, and thus the lower the current flowing to the output vop, vom of the amplifier circuit 230.

As also previously mentioned, each amplifier component further comprises a second power amplifier transistor M4, M3 operably coupled to an output vop, vom of the amplifier circuit 230, and driven by an output 410, 420 of the input stage. In particular, the gates of NMOS power transistors M3, M4 are connected to the outputs 410, 420 respectively of the input stage, and the source of each transistor M4, M3 is connected to the negative power rail vss. The drains of transistors M4, M3 are connected to outputs vop, vom of the amplifier circuit 230 respectively, Compensation capacitors C1, C2 are provided between the drains and gates of transistors M3, M4 respectively, and create a dominant pole for the differential amplification circuitry 310.

For each amplifier component, in the case where the output 410, 420 of the input stage by which the NMOS power transistor M4, M3 is driven, has a high voltage, this high voltage is communicated to the gate of the transistor M4, M3, thereby allowing current flow there through. In this manner, the voltage at the output vop, vom of the amplifier circuit 230 is pulled down towards the negative power rail vss (noting that increased current flow through M3, M4 is the cause, not the consequence, of the Vop, Vom voltage drop). As will be appreciated by a skilled artisan, the higher the voltage at the output 410, 420 of the input stage, the higher the current flowing through the transistor M3, M4 respectively.

Conversely, in a case where the output 410, 420 of the input stage by which the NMOS power transistor M4, M3 is driven has a low voltage, this low voltage is communicated to the gate of the transistor M4, M3, thereby restricting current flow there through. In this manner, the voltage at the output vop, vom of the amplifier circuit 230 is pulled down towards the negative power rail vss to a significantly lesser degree. As will be appreciated by a skilled artisan, the lower the voltage at the output 410, 420 of the input stage, the lower the current flowing through the transistor M3, M4 respectively.

Referring back to the example above, where a lower voltage is present at the first input vip of the amplifier circuit 230, and a higher voltage is present at the second input vim of the amplifier circuit 230, the first output 410 of the input stage will have a relatively higher voltage level than that of the second output 420 of the input stage.

As a consequence, since the first output 410 drives the current mirror 450 of the first amplifier component of the output stage, the high voltage at the first output 410 causes current to be allowed to flow through the power transistor M8 of the current mirror 450, thereby causing current to flow to the output vop of the amplifier circuit 230. Meanwhile, the low voltage at the second output 420 causes transistor M4 to hinder current flow there through. Consequently, the current flowing through transistor M8 causes a high voltage at the output vop.

Conversely, since the second output 420 drives the current mirror 460 of the second amplifier component of the output stage, the low voltage at the second output 420 restricts current flowing through the power transistor M9 of the current mirror 460. Meanwhile, the high voltage at the first output 410 causes transistor M3 to allow current flow there through. Consequently, current is drawn from the output vom, causing a low voltage at the output vom.

As will be appreciated by a skilled artisan, both of the amplifier components within the output stage each use both outputs 410, 420 from the input stage, such that current sourced by power transistors M8 and M9 passes through the load and is sunk by power transistors M3, M4. In this manner, the load is advantageously driven in a balanced operation.

Referring back to FIG. 3, for the illustrated embodiment the amplifier circuit 230 further comprises quiescent current control loop 320, arranged to control the current sinks 440, and thereby provide quiescent current regulation to the outputs 410, 420 of the input stage of the differential amplification circuitry 310. The quiescent current regulation loop is intended to regulate the current flowing in power transistors M8, M9, M3 and M4 when the amplifier is in a quiescent state (for example when the amplifier is enabled, but there is no audio signal at its input). The goal of the quiescent current regulation loop is to control the current consumption of the amplifier when no audio signal is present at the input, to avoid wasting energy. The quiescent current regulation loop also ensures that a minimum current flows through the power transistors that would otherwise be completely turned 'off' by the differential amplifier circuitry when an audio signal of sufficient amplitude is present at the amplifier input. This minimum current flow helps to minimize the non-linearity of the power transistor, which is beneficial to the harmonic distortion performance of the amplifier.

Figure 5:
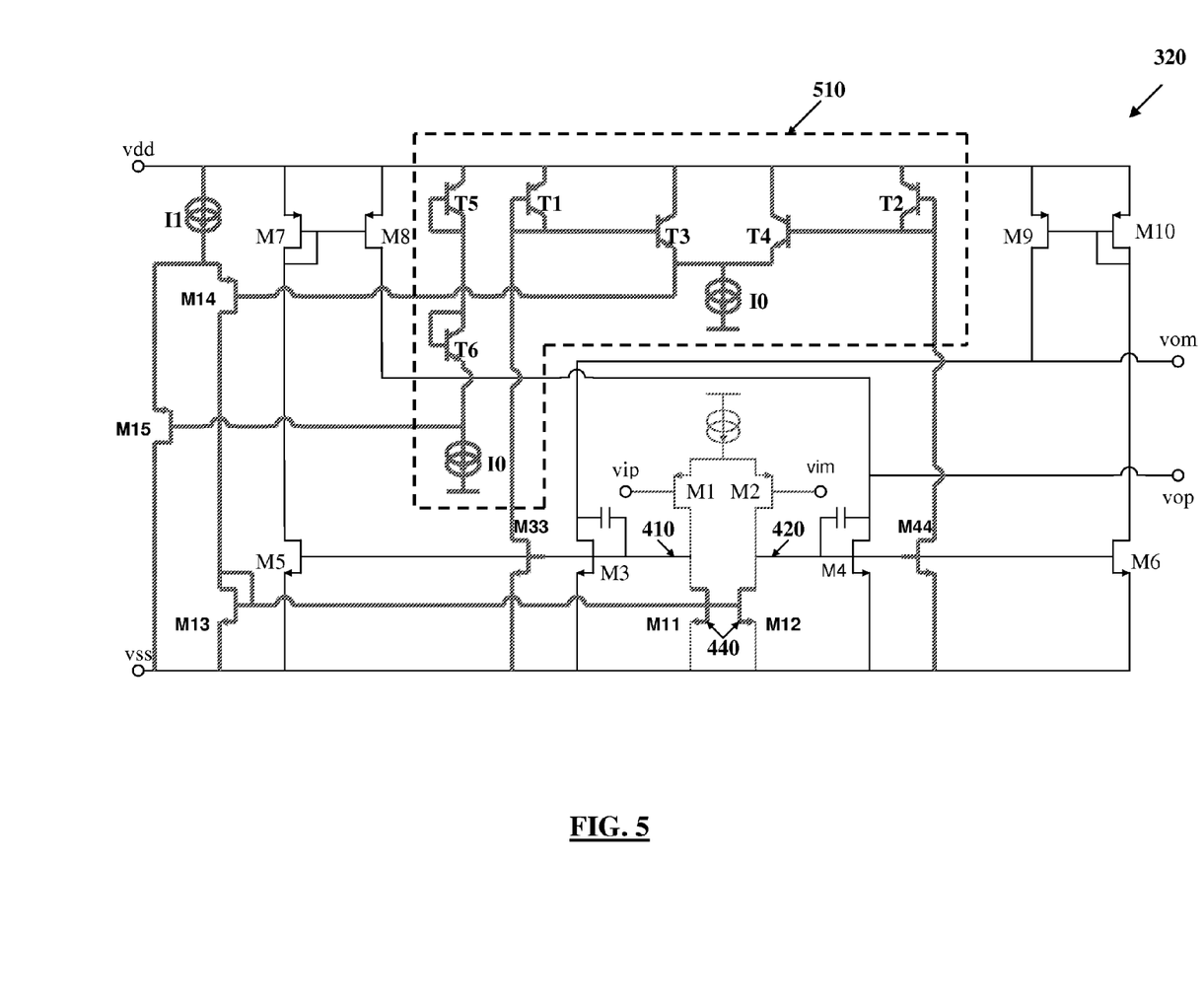
FIG. 5 illustrates an amplifier circuit comprising quiescent current control loop circuitry according to an embodiment of the invention.

Referring now to FIG. 5, there is illustrated the quiescent current control loop 320 in greater detail, according to an embodiment of the invention. The quiescent current regulation loop operates as follows: images of the output current in M4 and M3 are produced, thanks to M44 and M33 respectively. The minimum of these two images is extracted by the mean of the translinear bjt circuit 510. I0=Iref generates a voltage reference through T5 and T6 and the translinear circuit will produce the same voltage as this reference (Iref) if the copied (image) currents in M33 and M44 match the Iref current. If the copied (image) currents in M33 and M44 do not match the Iref current, a voltage error is produced and amplified through the M14/M15 differential stage.

The quiescent current control loop 320 comprises quiescent current sensing components, which for the illustrated embodiment comprise NMOS transistors M33 and M44. The gates of transistors M33 and M44 are connected to the outputs 410, 420 respectively of the input stage, and the source of each transistor M33, M44 is connected to the negative power rail vss.

The drains of transistors M33, M44 is connected to a translinear loop 510, which for the illustrated embodiment comprises NPN and PNP bipolar transistors T1 to T6. Translinear loop 510 provides minimum quiescent current functionality. The translinear loop 510 converts the current in M44/M33 into voltage information, for example M44 catches an image of the current flowing in M4 and this current is forwarded to the diode-mounted bi-polar junction transistor (BJT) T2 (which is a device matched to the reference transistor T5).

If, for example, the current in T2 is lower than the current in T1, the node to which emitters of T3 and T4 are connected will be driven by T4 because the base-emitter voltage of T3 will be smaller than the base-emitter voltage of T4. Consequently T3 will be turned 'off'. The whole Io current will then flow into T4. As T4 is matched to T6, the base-emitter voltage of T4 will be equal to the base-emitter voltage of T6. Hence, the difference between the M14 gate voltage and the M15 gate voltage will be equal to the difference between the base-emitter voltage of T5 (in which Io flows) and the base-emitter voltage of T2 (in which flows M44 current, a copy of M4 current).

If the M44 current is smaller than Io, then the gate voltage of M14 will be higher than the gate voltage of M15. Hence, the current flowing through M14 and M13 will decrease. By current mirroring, the current sunk by M11 and M12 will decrease as well, which will raise the voltage at the differential outputs 410 and 420. This results in an increase of the current in M4 and M44 until M44 current reaches Io. Outputs of the translinear loop 510 are provided to gates of differential transistor pair M14/M15, which in turn drive, and thereby regulate, current sink transistors M11, M12 (providing the functionality of current sinks 440) via transistor M13. In the same way as for the differential amplification circuitry 310, capacitors C1 and C2 create a dominant pole for the quiescent current control loop 320. The quiescent current control loop 320 shares the same high impedance nodes as the differential outputs 410 and 420. As a consequence, any compensation scheme made for the differential amplification will be shared also by the quiescent current loop, which is a major advantage regarding silicon area savings as a designer no longer needs to add bulky capacitors to compensate specifically the quiescent current loop.

If the drain currents of both sensing transistors M33 and M44 increase, indicating a high quiescent current, the current flowing through both M33 and M44 will also increase, causing the translinear loop to decrease the voltage presented to the gate of PMOS transistor M14. The decrease in the gate voltage of transistor M14 causes the current flowing through transistor M14 to increase, which in turn increases the drain currents of current sink transistors M11 and M12. As a result, the current flow through transistors M11 and M12 is increased, which decreases the voltage at the outputs 410, 420 of the input stage, correcting the quiescent current in power transistors M3 and M4.

In the presence of an input signal at the inputs vip, vim of the amplifier circuit 230, transistors M1 and M2 differentially drive the outputs 410, 420 of the input stage. If, for example, the current at the gate of transistor M33 is increased, and the current at the gate of transistor M44 is decreased, the translinear loop 510 regulates the drain current of M44 to a minimum value. In this manner, the gate voltage of transistors M11 and M12 is decreased, strengthening the increase in the voltage at the first output 410 of the input stage, whilst preventing the voltage at the second output 420 of the input stage from dropping below a minimum voltage, thereby regulating a minimum quiescent current in transistors M4, M44 and M6. By regulating a minimum quiescent current in this manner, cross-over distortion may be advantageously substantially eliminated.

The quiescent current regulation is advantageously independent of the voltages at the outputs vop, vom of amplifier circuit 230 due to the sensing and regulation of quiescent current being performed at the outputs 410, 420 of the input stage. In contrast to prior art circuits, quiescent current regulation is achieved by sensing and regulating currents in power transistors M3 and M4 (NMOS only). The quiescent current in PMOS power transistors (M8 and M9) does not need to be regulated, since it is set by the power NMOS current through current mirroring. In prior art circuits, the quiescent current regulation circuits are more complex and require much more silicon area due to the need to sense and regulate the currents in both NMOS and PMOS power transistors Referring now to FIG. 6, there is illustrated the variable offset buffers (for example buffers 330 from FIG. 3), each in a form of transistor pair M20/M21 and M22/M23, and common mode control loop 610 providing output common mode feedback, according to an embodiment of the invention. Resistor pair R1/R2, located between the outputs vop, vom of amplifier circuit 230, provides an input signal vcm to the common mode control loop 610. The common mode control loop 610 comprises a differential NMOS transistor pair M16, M17, the gates of which are connected to the voltage control mode input signal vcm and a voltage reference signal vcm_ref respectively. The transistor pair M16, M17, along with transistors M24 and M25, amplify a difference (error) between the voltage control mode input signal vcm and a voltage reference signal vcm_ref, and provide this amplified difference (error) voltage to gates of transistors M18 and M19, which provide control currents to the variable offset buffers 330.

Figure 6:
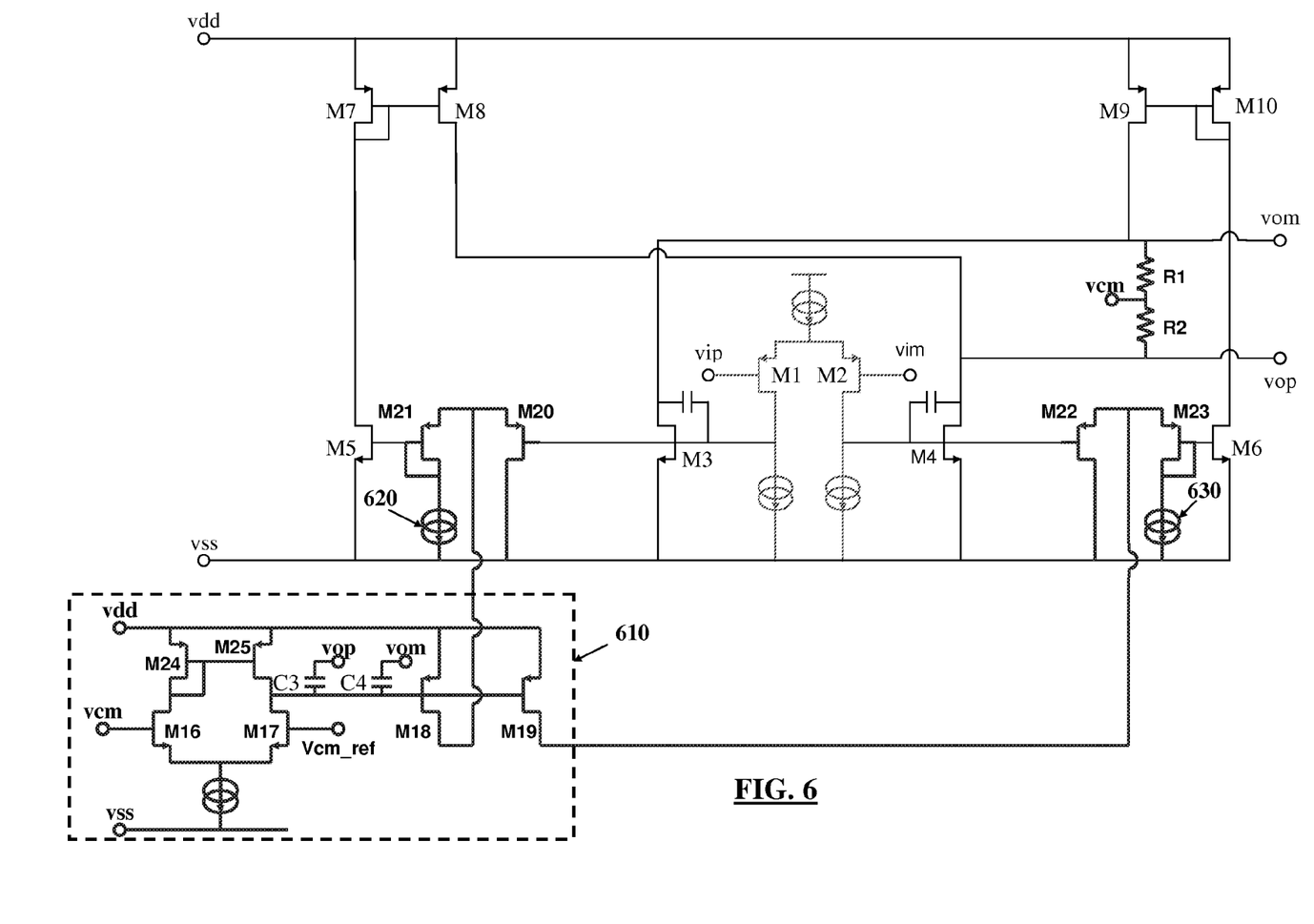
FIG. 6 illustrates an amplifier circuit comprising common mode voltage control circuitry according to an embodiment of the invention.

The common mode voltage regulation is provided in the following manner. Let us suppose that vop and vom average voltage is lower than the common mode voltage reference (VAG=vcm_ref). That is to say (vop+vom)/2<VAG. This will create a negative error at the input of the corresponding error amplifier 610, thereby inducing a higher gate drive on M18 and M19 and inducing a positive offset in the variable offset buffers 330. As a consequence, M9 will source more current than sinked by M3. In parallel, M8 will source more current than the current sinked by M4. vop and vom will then rise together, thereby reducing consequently the initial common voltage error.

For the illustrated embodiment, each variable offset buffer comprises a pair of PMOS transistors M20/M21, M22/M23. The gates of transistors M20 and M22 are connected to the outputs 410, 420 of the input stage respectively, whilst the gates of transistors M21 and M23 are connected to the gates of transistors M5 and M6 respectively. The drains of transistors M20 and M22 are connected to the negative power rail vss, whilst the drains of transistors M21 and M23 are connected to constant current sinks 620, 630. The sources of transistors M20 and M22 are connected to the sources of transistors M21 and M23 respectively, as well as to the outputs of the common mode control loop 610. Compensation capacitors C3, C4 are provided between the gates of transistors M18 and M19, and the outputs vop, vom respectively, and create a dominant pole for the common mode control loop 610.

The voltage across the gate and source of transistor M5 ($M5_{vgs}$) and the voltage across the gate and source of transistor M6 ($M6_{vgs}$) may be represented as follows: —

$$M5_{vgs}=M3_{vgs}+(M20_{vgs}-M21_{vgs})$$

$$M6_{vgs}=M4_{vgs}+(M22_{vgs}-M23_{vgs})$$

Note that M21vgs and M23vgs are constant as the current through M21 and M23 is constant, set by the current sinks 620 and 630.

In this manner, the variable offset buffers advantageously enable the disassociation of the drain currents of power PMOS transistors M8 and M9 from the drain currents of the power NMOS transistors M3 and M4 respectively. This disassociation of the PMOS currents from the NMOS currents makes common mode voltage regulation possible. If the amplifier is in a quiescent state (e.g. no input audio signal) and if the gates of M3 and M4 are directly connected to the gates of M5 and M6 (e.g. no variable offset buffers), any mismatch between the currents in the power PMOS (M8 and M9) and the power NMOS (M3 and M4) (for instance due to manufacturing tolerances) results in a common mode error at the amplifier output. For instance, if M8 and M9 provide a slightly higher current than the current that is sunk by M3 and M4 in the absence of audio signal, then both vop and vom will increase above vcm_ref. Note that the differential loop only ensures that vop=vom when no input signal is present. As a consequence of having the variable offset buffers, the currents of M8 and M9 may be decreased independently of M3 and M4 currents, which enable a correct common mode value for the outputs to be restored.

In an absence of an input signal at the inputs vip, vim of the amplifier circuit 230, and if component matching is ideal, the common mode control loop 610 forces the voltage across the gate and source of transistor M20 to be equal to that of transistor M21, by driving a current twice that of current sink 620 through transistor M18. Similarly, the common mode control loop 610 forces the voltage across the gate and source of transistor M22 to be equal to that of transistor M23, by driving a current twice that of current sink 630 through transistor M19.

In a case where the voltages at both outputs vop, vom of the amplifier circuit 230 are both low, the voltage control mode input signal vcm is lower than the voltage reference signal vcm_ref. Consequently, the gate drive of both transistors M18 and M19 is increased to increase the drain currents for transistors M20 and M22 respectively. In this manner, the gate drive of transistors M5 and M6 is increased relative to that of transistors M3 and M4 respectively. As a result, power PMOS transistors M8 and M9 source a higher current than M3 and M4, correcting the common mode output voltage.

Any mismatch affecting the NMOS transistors (M3/M5/M4/M6) and/or the PMOS transistors (M7/M8/M9/M10) of the output stage is advantageously corrected by substantially simultaneous action of the differential amplification circuitry 310, the common mode control loop 610 and the variable offset buffers 330, and does not result in output voltage errors. Consequently, component matching is not critical, and so each of the NMOS and PMOS power transistors (M3 to M10) may have minimum channel length. M8/M9 and M3/M4 are the output devices, sometimes referred to as 'pass devices' because in power amplification those devices need a high current capability. This leads to a high Width/Length ratio. Thus, using a minimum channel length (L=Lmin) advantageously results in a considerable silicon area saving.

Figure 7:
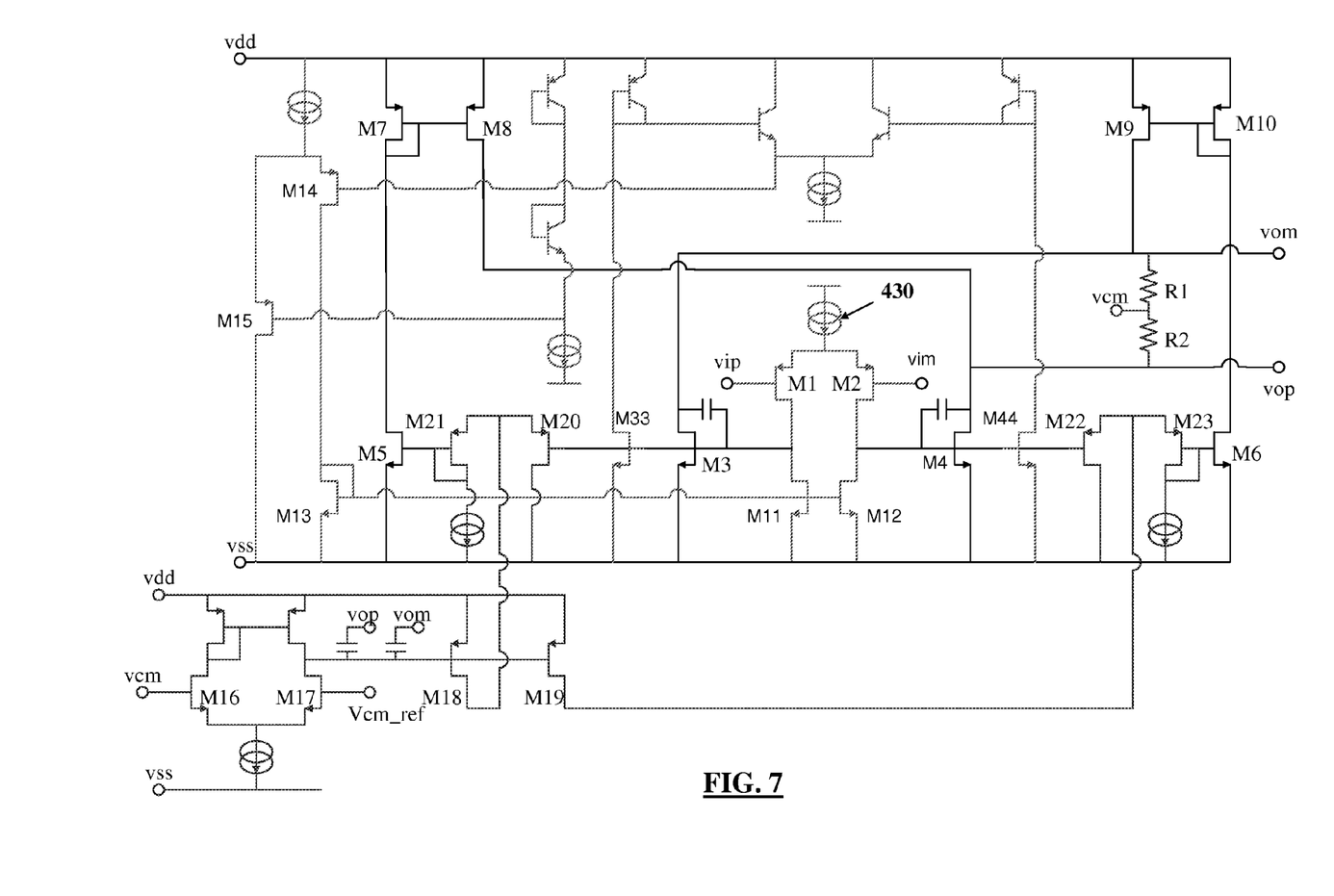
FIG. 7 illustrates an amplifier circuit comprising the differential amplification circuitry, quiescent current control circuitry and common mode control voltage circuitry of FIG's 4 to 6 according to an embodiment of the invention.

FIG. 7 illustrates a more detailed configuration of the amplifier circuit 230 of FIG. 3, comprising the differential amplification circuitry 310 of FIG. 4, the quiescent current control loop 320 of FIG. 5, and the common mode control loop 610 of FIG. 6. The differential amplification circuitry 310, quiescent current control loop 320 and common mode control loop 610 act substantially concurrently to regulate the outputs vop, vom, the common mode voltage and the quiescent current of the amplifier circuit 230, thereby providing a compact, differential class AB linear amplifier comprising a lower component count and requiring a small silicon area, whilst improving noise and current consumption.

Furthermore, and advantageously, the amplifier circuit 230 requires only four compensation capacitors, two for the differential amplification circuitry and quiescent current control loop (C1, C2), and two for the common mode control loop (C3, C4). Since conventional amplification circuitry typically requires a minimum of six compensation capacitors, a further saving in terms of component count and area is achieved.

Additionally, the supply of power to the output stage of the amplifier circuit 230 may furthermore be separated from the supply of power to the input stage, thereby facilitating the implementation of the output stage, combined with a DC/DC converter, for improved efficiency. If the amplifier is supplied from the battery, for example, the output power devices will see a higher Vds compared to a DC/DC application. The power wasted in these devices would be then higher thereby resulting in lower efficiency.

As the output stage is the most power consuming stage, supplying other stages with the DC/DC converters would not improve the efficiency as they use much lower current. Moreover, using the DC/DC converter to supply the input would bring high frequency noise to sensitive analogue parts of the amplifier. This high frequency noise could disturb the operation of the amplifier, resulting in higher output noise and/or degraded Total Harmonic Distortion.

Referring back to FIG. 2, it can be seen that a further advantage provided by the use of a single amplifier circuit 230 is that only a single resistive feedback network, comprising resistors R1, R2, R3 and R4 is required, as opposed to two resistive feedback networks for the conventional amplification circuitry of FIG. 1, thereby providing a further reduction in the component count and the required silicon area.

It is envisaged that the inventive concept is not limited to an amplifier circuit, and a semiconductor device comprising an amplifier circuit, for use within electronic devices such as mobile telephone handsets. It is also envisaged that the inventive concept is not limited to an amplifier circuit, and a semiconductor device comprising an amplifier circuit, for providing a differential signal to a speaker, such as a piezo-ceramic speaker. It is envisaged that the inventive concept may be applied to any linear amplifier, such as a class AB amplifier where a differential output, high speed and/or high slew rate power amplifier is desirable, such as a Digital Subscriber Line (xDSL), line driver (twisted pair), or a video amplifier (video composite) may be used. Furthermore, the inventive concept is not limited to implementation within a class AB amplifier.

It will be understood that the amplifier circuit and semiconductor device comprising the amplifier circuit, as described above, aim to provide at least one or more of the following advantages:
(i) a single amplifier circuit, requiring only a single resistive feedback network and a single output stage quiescent current control circuit, resulting in lower component count, reduced silicon area, reduced noise and reduced quiescent current;
(ii) use of a Miller OTA, resulting in lower component count, reduced silicon area, reduced noise and reduced quiescent current.
(iii) a reduction in the number of compensation capacitors required, resulting in reduced silicon area and a lower component count.

In particular, it is envisaged that the aforementioned inventive concept can be applied by a semiconductor manufacturer to any integrated circuit architecture supporting an improved amplifier circuit. It is further envisaged that, for example, a semiconductor manufacturer may employ the inventive concept in a design of a stand-alone device, or application-specific integrated circuit (ASIC) and/or any other sub-system element employing an integrated circuit to support an improved amplifier circuit.

It will be appreciated that any suitable distribution of functionality between different functional units or controllers, may be used without detracting from the inventive concept herein described. Hence, references to specific functional devices or elements are only to be seen as references to suitable means for providing the described functionality, rather than indicative of a strict logical or physical structure or organization.

The elements and components of an embodiment of the invention may be physically, functionally and logically implemented in any suitable way. Indeed, the functionality may be implemented in a single unit or IC, in a plurality of units or ICs or as part of other functional units.

Although the inventive concept has been described in connection with some embodiments, it is not intended to be limited to the specific form set forth herein. Rather, the scope of the invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc. do not preclude a plurality.

Thus, an improved amplifier circuit, and semiconductor device comprising an amplifier circuit have been described, where the aforementioned disadvantages with prior art arrangements have been substantially alleviated.

The invention claimed is:
1. A linear amplifier circuit comprises:
   differential amplification circuitry comprising:
      an input stage having first and second differential inputs, and
      an output stage, having respective first and second amplifier components with first and second differential outputs;
   wherein the first amplifier component of the output stage comprises:
      a first power transistor operably coupled to the first differential output and driven by a first differential output of the input stage, and a third power transistor operably coupled to the first differential output of the amplifier circuit and driven at a control electrode by a voltage at a second output of the input stage, wherein the second amplifier component comprises:

a second power transistor operably coupled to the second differential output and driven by a second output of the input stage, and a fourth power transistor operably coupled to the second differential output and driven at a control electrode by a voltage at the first output of the input stage;

wherein each of the first and second power transistors of the first and second amplifier components is driven in a current mirror arrangement by the respective first and second output of the input stage.

2. The linear amplifier circuit of claim 1 wherein the input stage comprises a first transistor and a second transistor arranged to provide a matched transistor pair operably coupling the first and second differential inputs to the respective first and second outputs of the input stage.

3. The linear amplifier circuit of claim 2 wherein the first and second transistors of the input stage each comprise a P-Channel Metal Oxide Semiconductor Field Effect Transistor.

4. The linear amplifier circuit of claim 2 wherein the first and second power transistors of the first and second amplifier components each comprise a P-Channel Metal Oxide Semiconductor Field Effect transistor, and the third and fourth power transistors of the first and second amplifier components each comprising a N-Channel Metal Oxide Semiconductor Field Effect transistor.

5. The linear amplifier circuit of claim 2 wherein the first and second outputs of the input stage are connected to the current sinks.

6. The linear amplifier circuit of claim 2, wherein a common mode voltage control loop provides output common mode feedback to variable offset buffers and located between the first and second outputs of the input stage and the first and second power transistors of the output stage.

7. The linear amplifier circuit of claim 1 wherein the first and second power transistors of the first and second amplifier components each comprise a P-Channel Metal Oxide Semiconductor Field Effect transistor, and the third and fourth power transistors of the first and second amplifier components each comprising a N-Channel Metal Oxide Semiconductor Field Effect transistor.

8. The linear amplifier circuit of claim 7 wherein the first and second amplifier components of the output stage each comprise a common source NMOS PMOS current mirror, via which the first and second power transistors are driven by the respective first and second outputs of the input stage.

9. The linear amplifier circuit of claim 1 wherein the first and second outputs of the input stage are connected to the current sinks.

10. The linear amplifier circuit of claim 9 wherein the current sinks comprise N-Channel Metal Oxide Semiconductor Field Effect transistors.

11. The linear amplifier circuit of claim 9 wherein the amplifier circuit further comprises a quiescent current control loop, arranged to regulate the current sinks.

12. The linear amplifier circuit of claim 11, wherein the quiescent current control loop comprises quiescent current sensing components connected to the outputs of the input stage.

13. The linear amplifier circuit of claim 12, wherein the quiescent current control loop further comprises a translinear loop connected to the quiescent current sensing components.

14. The linear amplifier circuit of claim 13 wherein outputs of the translinear loop are provided to a differential transistor pair, which in turn drive the current sinks.

15. The linear amplifier circuit of claim 1, wherein a common mode voltage control loop provides output common mode feedback to variable offset buffers and located between the first and second outputs of the input stage and the first and second power transistors of the output stage.

16. The linear amplifier circuit of claim 15 wherein the common mode control loop comprises a resistor pair, located between the first and second differential outputs arranged to provide an input signal to the common mode voltage control loop.

17. The linear amplifier circuit of claim 16 wherein the common mode control loop comprises a transistor pair arranged to receive a voltage control mode input signal and a voltage reference signal, and to amplify a difference between the voltage control mode input signal and a voltage reference signal.

18. The linear amplifier circuit of claim 1 wherein the first and second amplifier components of the output stage are class AB linear amplifier components.

19. The linear amplifier circuit of claim 1 wherein the output stage is arranged to provide a differential signal to a speaker.

20. A semiconductor device comprising a linear amplifier circuit, according to claim 1.

* * * * *